United States Patent [19]

Tsujimoto

[11] Patent Number: 5,033,026
[45] Date of Patent: Jul. 16, 1991

[54] PSEUDO-STATIC RANDOM ACCESS MEMORY

[75] Inventor: Akira Tsujimoto, Tokyo, Japan

[73] Assignee: NEC Corporation, Tokyo, Japan

[21] Appl. No.: 302,891

[22] Filed: Jan. 30, 1989

[30] Foreign Application Priority Data

Jan. 29, 1988 [JP] Japan .................................. 63-20275

[51] Int. Cl.⁵ .............................................. G11C 7/00
[52] U.S. Cl. .................................... 365/222; 365/194
[58] Field of Search ......................... 365/194, 222, 233

[56] References Cited

U.S. PATENT DOCUMENTS 4,581,718 4/1986 Oishi .................................... 365/194

Primary Examiner—Joseph A. Popek
Attorney, Agent, or Firm—Sughrue, Mion, Zinn, Macpeak & Seas

[57] ABSTRACT

A pseudo-static RAM device is disclosed which operates at high speed in the reading or writing mode and permits a long refreshing period in the self-refreshing mode. In the pseudo-static RAM of the present invention, an activation signal for enabling the sense amplifiers is generated with a variable delay time, from a time point when a designated word line is driven. The delay time is switched in response to a control signal representing the self-refreshing mode to be long enough to transfer 100% of the amount of information stored in the designated driven memory cell to the bit line connected thereto, and is maintained short when the control signal representing the self-refreshing mode is not present.

3 Claims, 7 Drawing Sheets

PSEUDO-STATIC RANDOM ACCESS MEMORY

BACKGROUND OF THE INVENTION

The present invention relates to a semiconductor memory device and more particularly, to a semiconductor integrated circuit pseudo-static random access memory.

The pseudo-static random access memory (RAM) includes a dynamic random access memory cell array which requires refresh operation in the stand-by state, a peripheral circuit for making access to a designated memory cell in the memory cell array and for outputting or inputting data from or into the designated cell, and an internal refresh circuit. It takes advantage of the low cost of a large capacity dynamic random access memory. Its built-in internal refresh circuit accomplishes the refreshing operation for the dynamic random access memory in the stand-by state automatically (self-refreshing mode), eliminating the disadvantage of the dynamic random access memory that requires a complicated external control for refreshment.

The reading or writing operation of the dynamic random access memory matrix should be as fast as possible and accordingly, the memory cycle is made short. For that purpose, a time period from activation or driving of a selected word line to activation or enabling of a sense amplifier is reduced to an extent that the sense amplifier is enabled before 100% of the amount of information (i.e., amount of electric charges) stored in a designated memory cell, which is connected to the driven word line, is transferred to the bit line which is connected to the designated memory cell and to the sense amplifier in case the memory cell stores the "1" information or that the memory cell which stores the "0" information is fully charged. This shortens the data-holding time of memory cells, and therefore, the refreshing period in the self-refreshing mode cannot be made long. It is desirable in view of suppressing the power consumption in the stand-by state to make the refreshing period in the self-refreshing mode 5 to 10 times longer than that in the normal operation. Since the refreshing period cannot be made so long, the power consumption in the self-refreshing operation is increased in the prior art pseudo-static RAM.

SUMMARY OF THE INVENTION

It is therefore an object of the present invention to provide a pseudo-static RAM device which has high speed operation in the reading or writing mode and permits a long refreshing period in the self-refreshing mode.

The present invention is featured by generating an activation signal for enabling the sense amplifiers with a variable delay time from a time point when a designated word line is driven. The delay time is switched in response to a control signal representing the self-refreshing mode such that is long enough to transfer 100% of the information from the designated driven memory cell to the bit line connected thereto or vice versa, and is maintained short when the control signal representing the self-refreshing mode is not present.

According to the present invention, the pseudo-static RAM has a long refreshing period with a longer period between the time point when the designated word line is driven and the time point when the sense amplifiers are enabled in the self-refreshing mode and has a short memory cycle with the period between the mentioned time points being shorter in the other modes.

In the case where a two-stage amplification type sense amplifier is used as the sense amplifier, an activation signal for the second-stage amplification may be generated with a delay time from generation of an activation signal for the first-stage amplification in response to the control signal representing the self-refreshing mode, which delay time is sufficient to assure the full sensitivity of the sense amplifier. When the mentioned control signal is absent, the delay time between the two activation signals is made shorter to obtain a fast operation at the sacrifice of the sensitivity of the sense amplifier.

BRIEF DESCRIPTION OF THE DRAWINGS

The above and the other objects, features and advantage of the present invention will become more apparent from the following description taken in conjunction with the accompanying drawings. In the drawings.

DETAILED DESCRIPTION OF THE PREFERRED EMBODIMENTS

Figure 1:
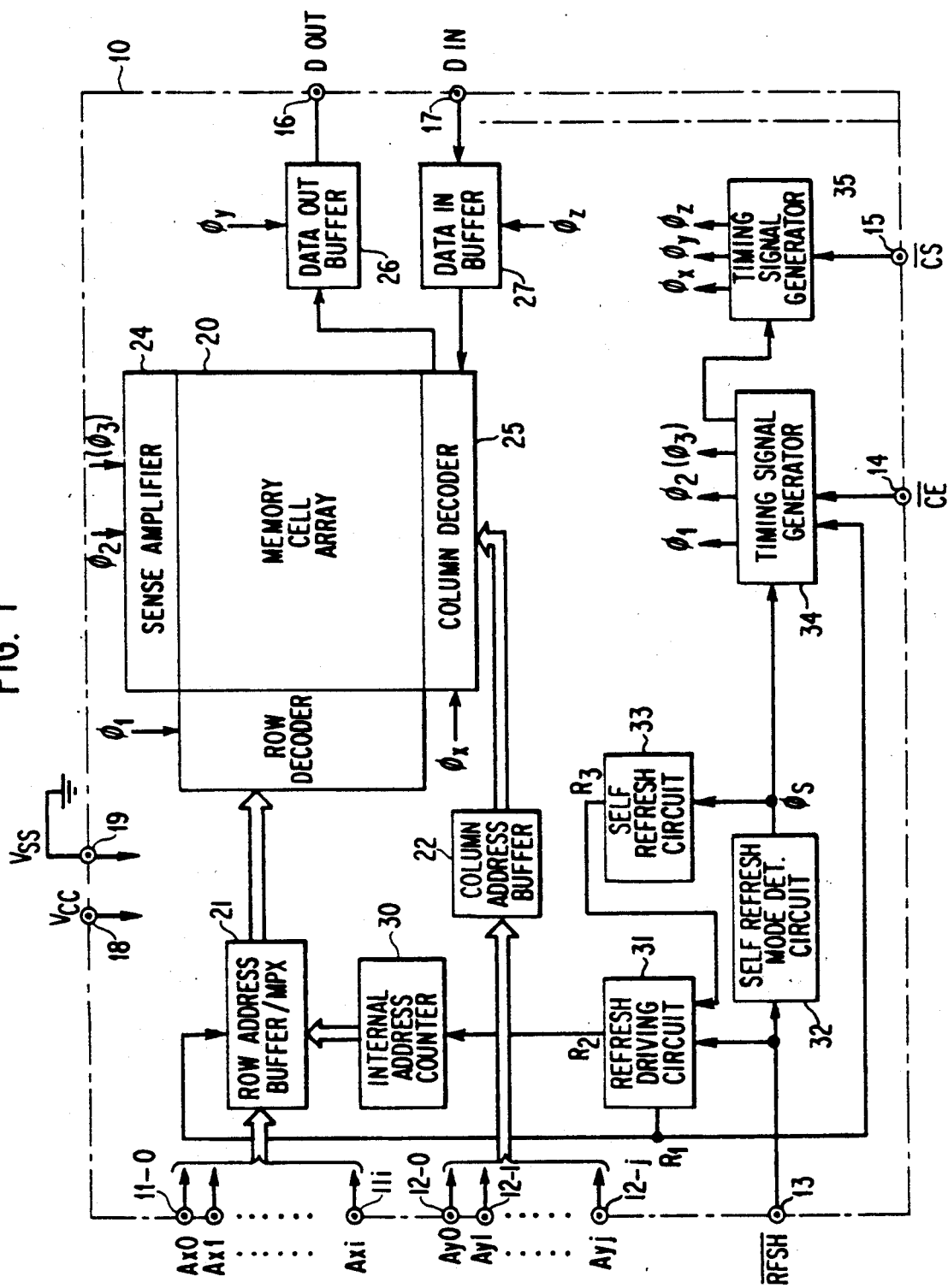
FIG. 1 is a block diagram of a pseudo-static RAM according to an embodiment of the present invention.

Referring to FIG. 1, an integrated circuit chip 10 of a pseudo-static RAM according to an embodiment of the present invention has row address input terminals 11-0, 11-1, ..., 11-i which receive row address signals $A_{x0}$, $A_{x1}$, ..., $A_{xi}$, column address input terminals 12-0, 12-1, ..., 12-j which receive column address signals $A_{y0}$, $A_{y1}$, ..., $A_{yj}$, a refresh signal input terminal 13 which receives a refresh signal $\overline{RFSH}$, a chip-enable signal input terminal 14 receiving a chip-enable signal $\overline{CE}$, a chip-select signal input terminal 15 receiving a chip-select signal $\overline{CS}$, a data output terminal 16 from which a read-out data $D_{OUT}$ is outputted, a data input terminal 17 to which a data $D_{IN}$ to be written is inputted, and power source terminals 18 and 19 to which power voltages $V_{CC}$ and $V_{SS}$ are supplied, respectively. The row address signals $A_{x0}$, $A_{x1}$, ..., $A_{xi}$ inputted to the row address input terminals 11-0, 11-1, ..., 11-i are applied, through a row address buffer/multiplexer 21, to a row decoder 23 to select a designated word line in a memory cell matrix 20. The row decoder 23 is enabled by a timing signal $\phi_1$ which is in turn generated in a timing signal generator 34 in response to a chip-enable signal $\overline{CE}$ applied to the chip-enable signal input terminal 14. Thereafter, sense amplifiers 24 are activated by a timing signal $\phi_2$, which is in turn generated in the timing signal generator 34 with a delay after generation of the timing signal $\phi_1$, to amplify signals appearing on bit lines of all the memory cells connected to the selected word line in the cell matrix 20 and rewrite them to the same memory cells. The column address signals $A_{y0}, A_{y1}, \ldots, A_{yj}$ at the column address input terminals 12-0, 12-1, ..., 12-j are applied, through a column address buffer 22 to a column decoder 25 to select a bit line among the bit lines with the amplified data signals thereon. In the reading mode, the data signal on the selected bit line is read out, through a data-out buffer 26, from the data output terminal 16. In the writing mode, a data signal $D_{IN}$ is applied from the data input terminal 17 via a data-in buffer to the selected bit line to be written into the selected memory cell. Timing signals $\phi_x$, $\phi_y$ and $\phi_z$ which activate the column decoder 25, the data-out buffer 26 and the data-in buffer 27, respectively, are generated in a timing signal generator 35 in response to a chip-select signal $\overline{CS}$ when it is supplied to the chip-select signal input terminal 15.

Figure 4:
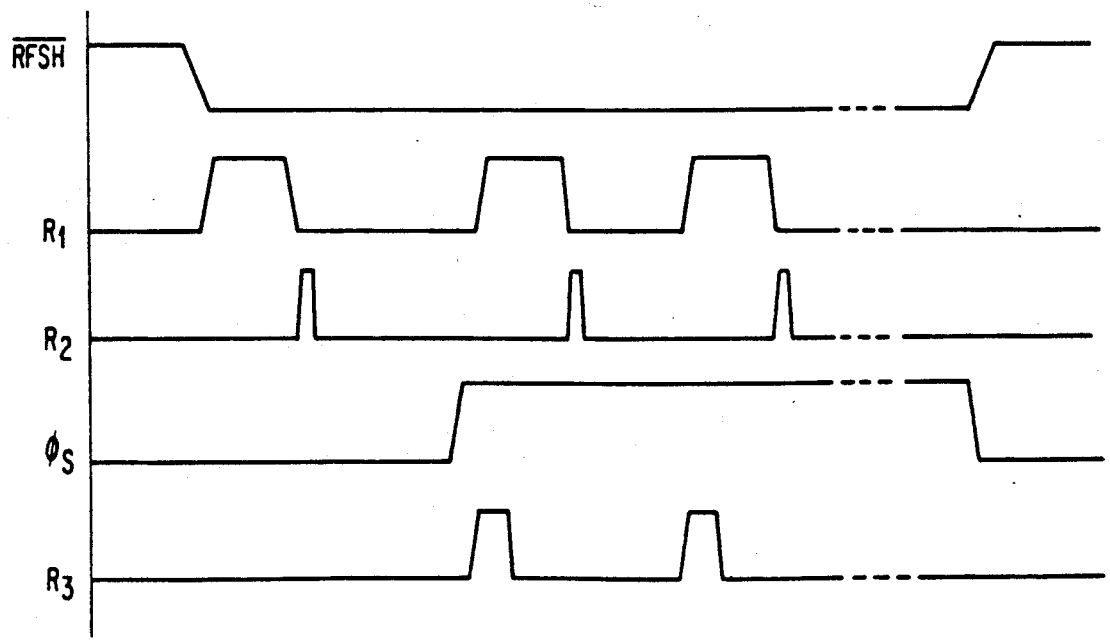
FIG. 4 is a signal waveform diagram for explaining the self-refreshing operation of FIG. 1.

Referring also to FIG. 4, an internal refresh control signal $R_1$ and an internal address counter increment signal $R_2$ are generated in a refresh driving circuit 31 every time the refresh signal $\overline{RFSH}$ at the refresh signal input terminal 13 falls to the low level. The internal refresh control signal $R_1$ is supplied to the row address multiplexer 21 which thereby transfers internal address signals from an internal address counter 30 to the row decoder 23 as a row address, instead of the input row address signals from the row address input terminals 11-0 to 11-i. The signal $R_1$ is also supplied to the timing signal generator 34 which thereby produces the signals $\phi_1$ and $\phi_2$. The row decoder 23 selects one of the word lines of the cell matrix 20, which is designated by the internal address signals, and the data signals of the memory cells connected to the selected word line are amplified by the sense amplifiers 24 and restored, as mentioned above. Thus, the refresh operation for the memory cells on one row is carried out, and the content of the internal address counter 30 is increased by one by the internal address counter increment signal $R_2$.

If the levels of the $\overline{RFSH}$ signal are externally changed periodically, the signals $R_1$ and $R_2$ are accordingly generated periodically and the refreshing operation is carried out for the succeeding rows one by one.

In case the low level of the $\overline{RFSH}$ signal continues for a predetermined period of time, a self-refresh mode detection circuit 32 detects it and determines that the self-refreshing mode is to be started internally. As a result, the circuit 32 generates a control signal $\phi_S$ which represents the self-refreshing mode, and sends it to the timing signal generator 34 and to the self-refresh circuit 33 which thereby periodically generates refresh request signals $R_3$ with a relatively long interval. In response to the refresh request signal $R_3$, the refresh driving circuit 31 also generates the signals $R_1$ and $R_2$, so that refreshing operation (self-refreshing operation) is carried out for the succeeding rows one by one with a relatively long time internal.

Figure 2:
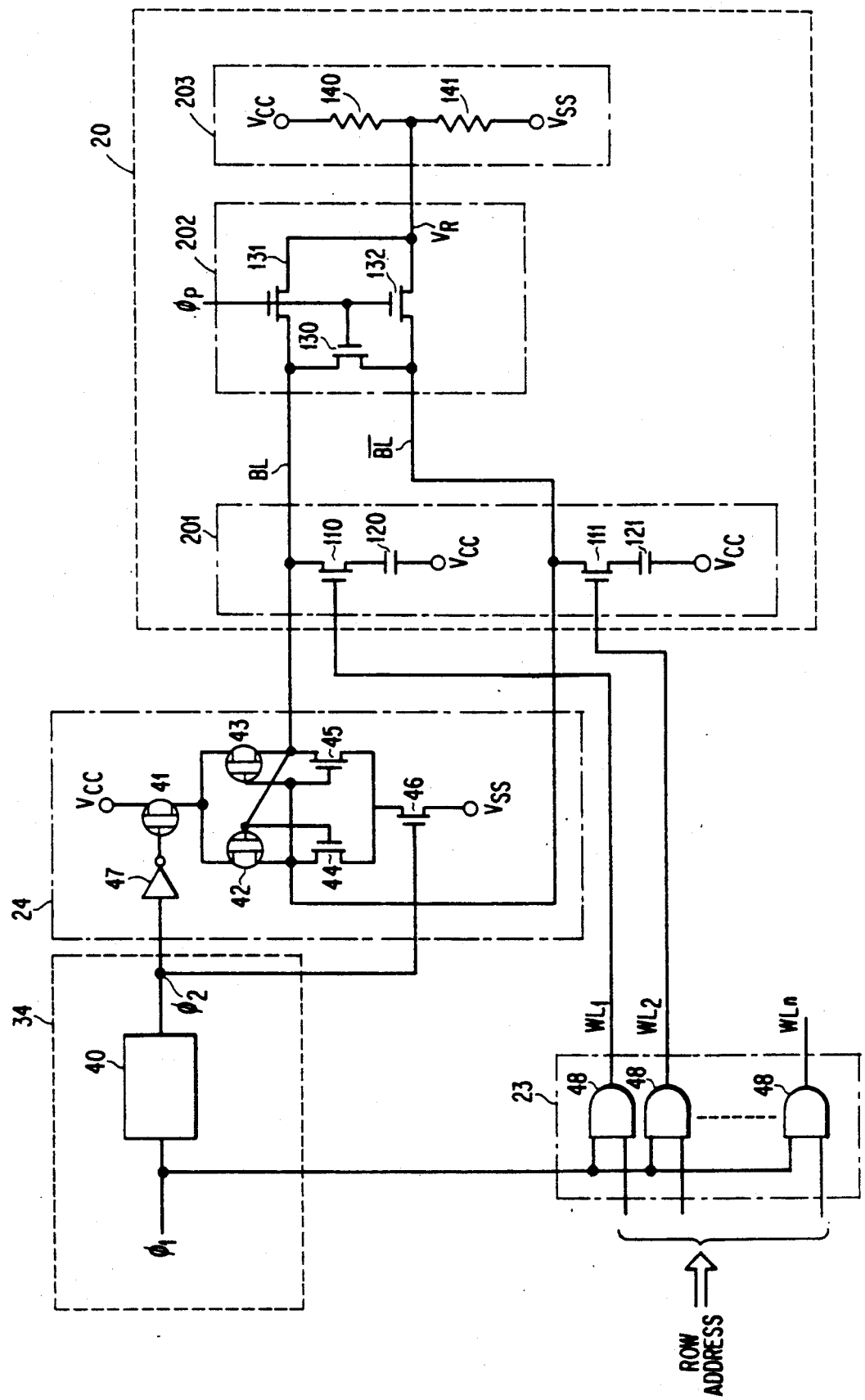
FIG. 2 is a circuit diagram showing several blocks of FIG. 1.
Figure 3:
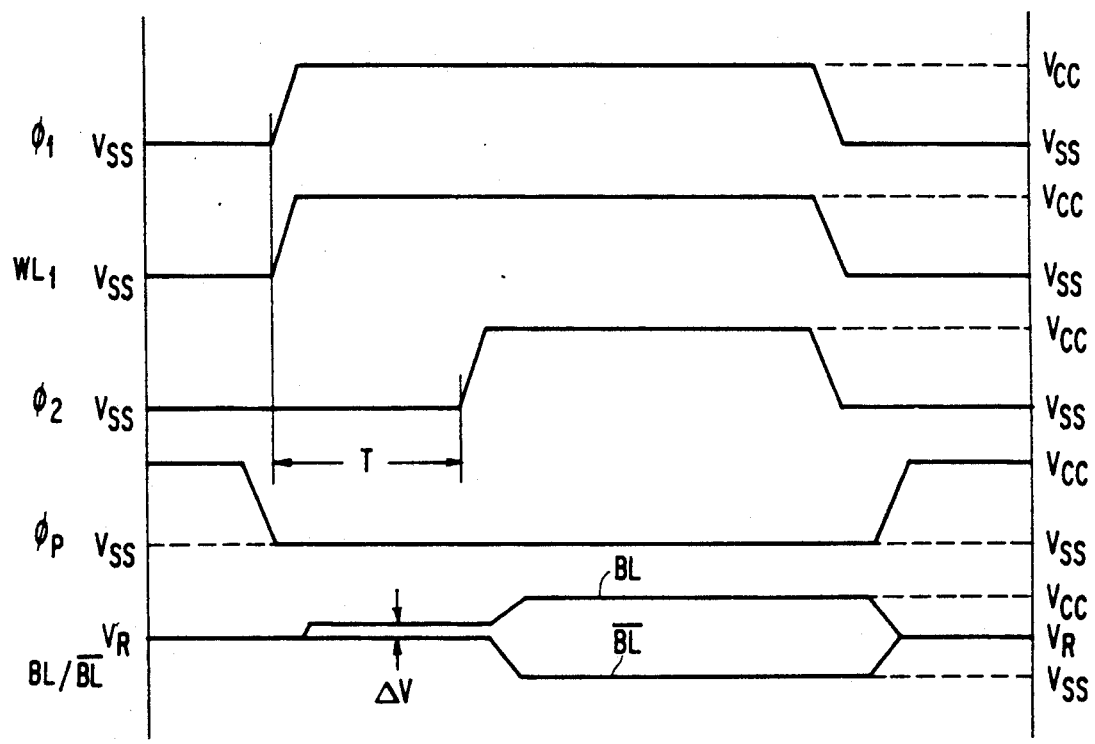
FIG. 3 is a signal waveform diagram for explaining the reading and refreshing operation of FIG. 1.
Figure 6:
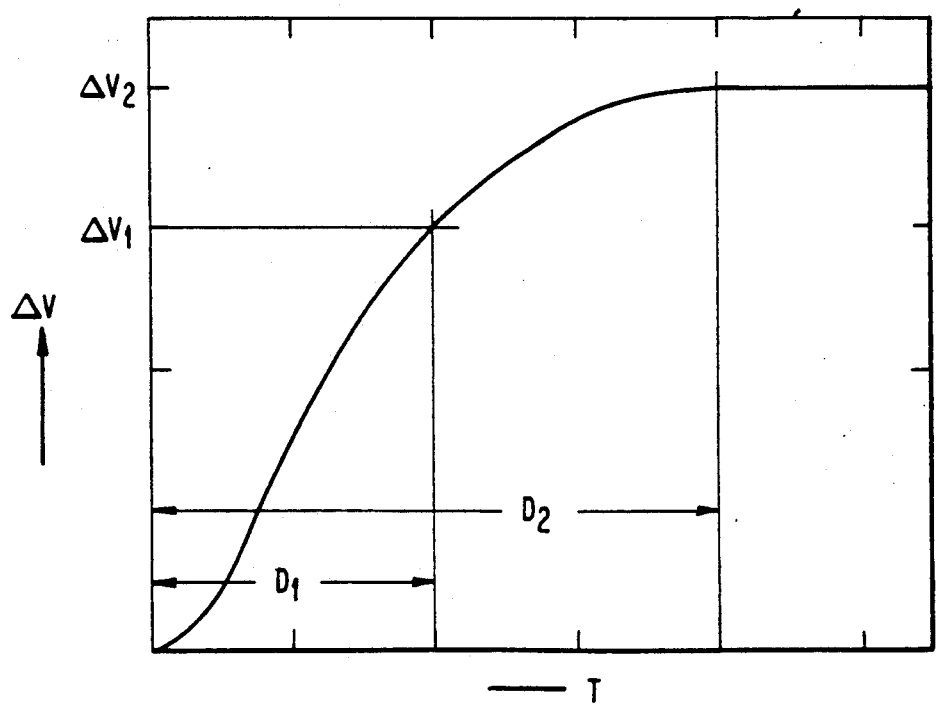
FIG. 6 is a graph for explaining how the varied delay times are determined in FIG. 1.
Figure 7A:
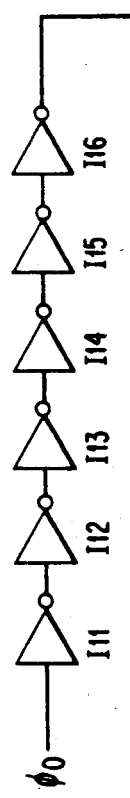
FIGS. 7A, 7B and 7C are circuit diagrams showing another example of the variable delay time circuit of FIG. 1.
Figure 7C:
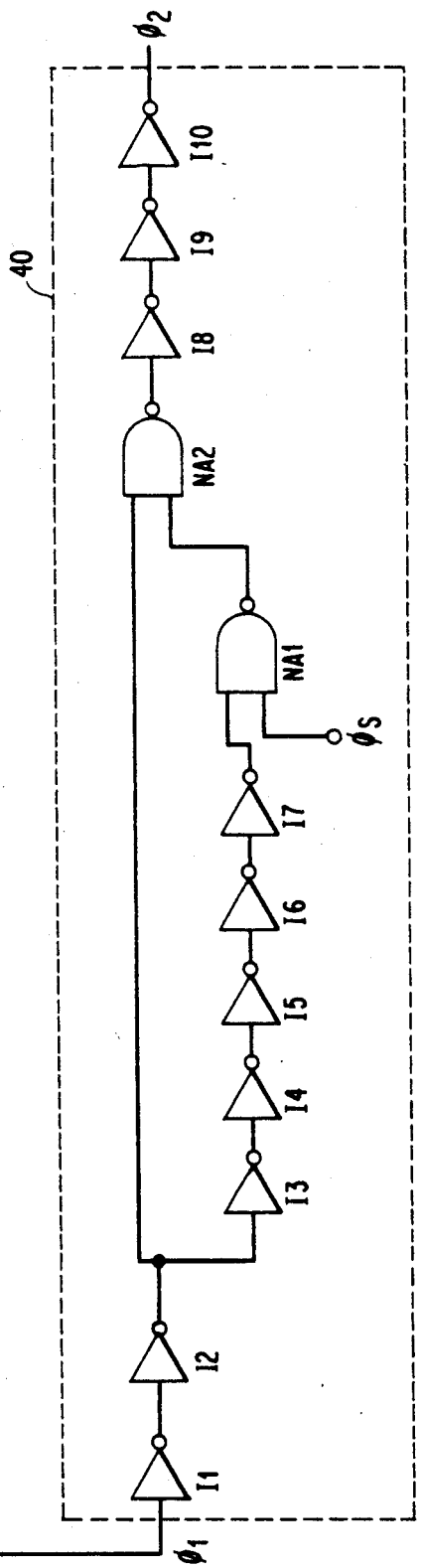
Figure 7C:
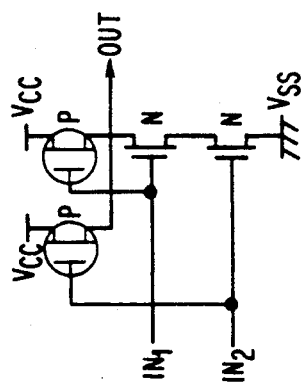
Figure 7B:
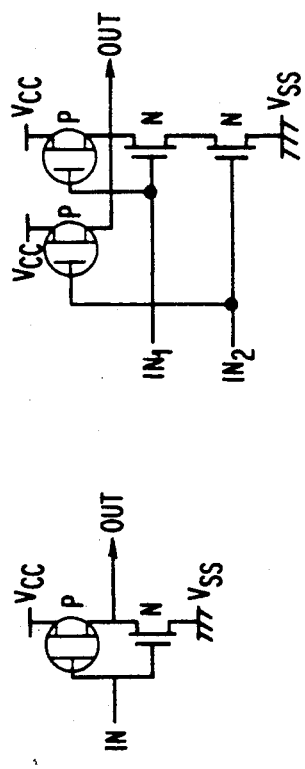

Referring to FIG. 2, one example of the row decoder 23 comprises a plurality of two-input AND gates 48 having one of their inputs connected to different address lines and the other of their inputs connected in common to a source of the timing signal $\phi_1$. The sense amplifiers 24 (only one is illustrated) each has a flip-flop composed of two P-channel MOS transistors (MOSPT) 42 and 43 and two N-channel MOS transistors 44 and 45 and a pair of large sized P- and N-channel transistors 41 and 46 connected between the flip-flop and the power sources $V_{CC}$ and $V_{SS}$, respectively, as enabling gates. The memory cell matrix 20 includes a plurality of memory cells 201 (only two cells are illustrated), a bit-line balancing circuit 202 composed of three N-channel transistors 130, 131 and 132 for each pair of bit lines BL and $\overline{BL}$, and an intermediate potential generating circuit 203 with two resistors 140 and 141 connected between the $V_{CC}$ and $V_{SS}$ terminals. For example, $V_{CC}$ is 5 volts and $V_{SS}$ is 0 volt, and the intermediate potential $V_R$ is about 2 volts. Referring also to FIG. 3, before the start of the reading or refreshing operation, the potentials of the bit lines BL and $\overline{BL}$ are precharged at the potential $V_R$, through N-channel MOS transistors (hereinafter referred to as "MOSNT") 131 and 132 and balanced by the MOSNT 130. After a bit line precharge signal $\phi_p$ is reset, a word line driving signal $\phi_1$ is activated and a word line WL1 selected by the row decoder 23 is activated. If it is assumed that a memory cell composed of a MOSNT 110 and a capacitor 120 is held at the "1" level (that is, the state where a source potential of MOSNT 110 is higher than the potential $V_R$ at the BL), the MONST 110 is rendered conductive as a result of the activation of the WL1 and the level of the bit of the bit line BL rises by the potential of $$\Delta V = \frac{C_S \times (V_x - V_R)}{(C_D + C_S)},$$

which is determined by the ratio of a memory cell capacitance CS and a bit line capacitance CD and is, for example, 200 mV. Here, $V_x$ represents the initial potential of the memory cell. After a certain delay time T from the signal $\phi_1$ which is determined by the delay circuit 40 in the timing generator 34, a sense-amplifier activation signal $\phi_2$ is activated to amplify the initial potential difference $\Delta V$ between the bit lines and bring the bit line BL to the power source potential $V_{CC}$ and the bit line $\overline{BL}$ to the ground potential $V_{SS}$. As a result, the "1" level of the memory cell is read-and refreshed. In the prior art device, the delay circuit 40 has provided a fixed delay time T from the word line activation to the sense amplifier activation, which is shortened to make the read/write time and the memory cycle fast. FIG. 6 is a graph with the abscissa representing the delay time T and the ordinate representing the amount of change in the potential of the bit lines. It is seen that the amplification is started, by shortening the delay time T from $D_2$ (e.g., 20 nano sec.) to $D_1$ (e.g., 10 nano sec.) for the purpose of the fast operation, in the state ($\Delta V_1$, e.g., 160 mV) in which the transmission of the stored information (the stored charges) from the memory cell to the bit line is not 100%. The delay time of $D_2$ is necessary to transfer the whole charges to the bit line and to obtain the potential change $\Delta V_2$ of 200 mV. The refresh period in the self-refresh mode is usually set at about 5 to 10 times the refresh period in the ordinary operation, in order to reduce the current consumption in the stand-by state. As a result, the data holding time of the memory cells has become most severe in the self-refresh mode in the pseudo-static semiconductor memory device of the prior art, in which the amount of cell information is not utilized to 100% and the data holding time of the memory cell is shorter than that in case the amount of cell information is utilized to 100%, and the refresh period in the self-refreshing mode has not been able to make long enough to suppress the current consumption in the self-refresh operation.

Figure 5:
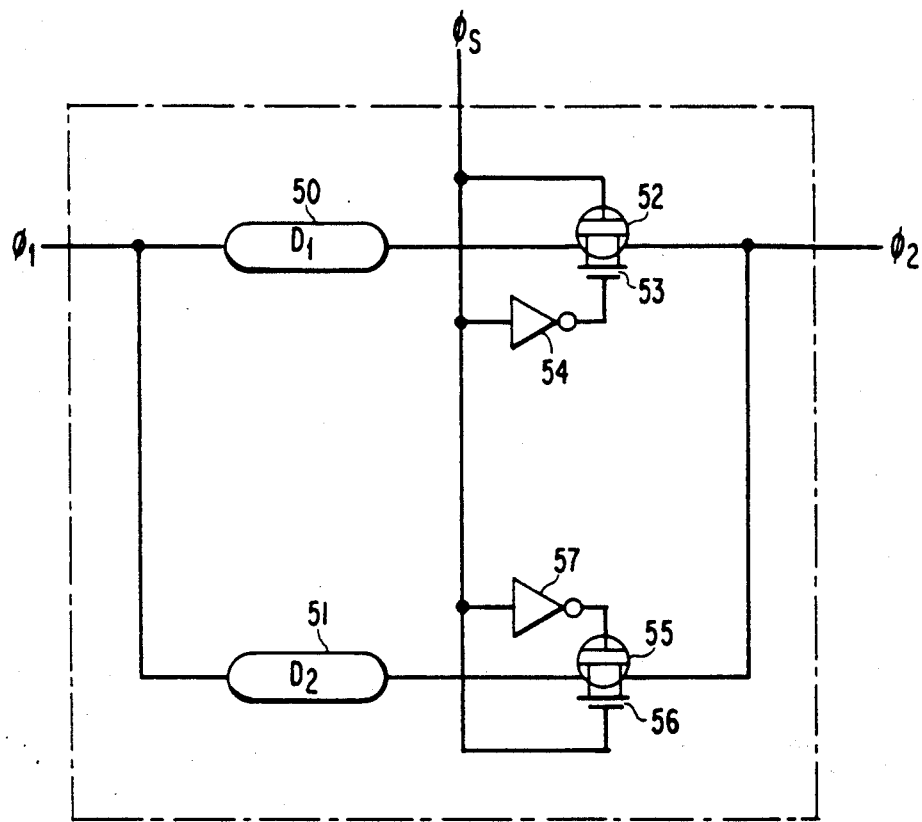
FIG. 5 is a circuit diagram showing one example of a variable delay time circuit of FIG. 1.

According to the present invention, the delay time T from the word line activation to the sense amplifier activation is set to be $D_2$ (e.g., 20 nano sec.) in FIG. 6 in the self-refreshing mode to utilize 100% of cell information and is switched to $D_1$ (e.g., 10 nano sec.) in the other modes to achieve the high-speed access. Referring to FIG. 5, the delay circuit 40 which produces the signal $\phi_2$ from the signal $\phi_1$ comprises a series connection of a delay element 50 having a short delay time $D_1$ and a transfer gate composed of a pair of the parallel connected MOSPT 52 and MOSNT 53 with an inverter 54 and another series connection of a delay element 51 having a longer delay time $D_2$ and a transfer gate made of the parallel connected MOSPT 55 with an inverter 57 and MOSNT 56. The two series connections are coupled in parallel. The transfer gates are switched under control of the control signal $\phi_S$ representing the self-refreshing mode. When the signal $\phi_S$ is absent, or at the low level, the transfer gate (52 and 53) is turned to ON and the sense amplifier activation signal $\phi_2$ is delayed by the delay element 50 for a short period of time $D_1$. When the signal $\phi_S$ is present, or at the high level, the transfer gate (55, 56) becomes ON and the sense amplifier activation signal $\phi_2$ is delayed by the delay element 51 for a longer period of time $D_2$. Thus, by the signal $\phi_S$ that takes the high level only in the self-refreshing mode, the time T from the word line activation to the sense amplifier activation can be switched to $D_2$ in the self-refreshing mode and to $D_1$ in the other modes.

Figure 8A:
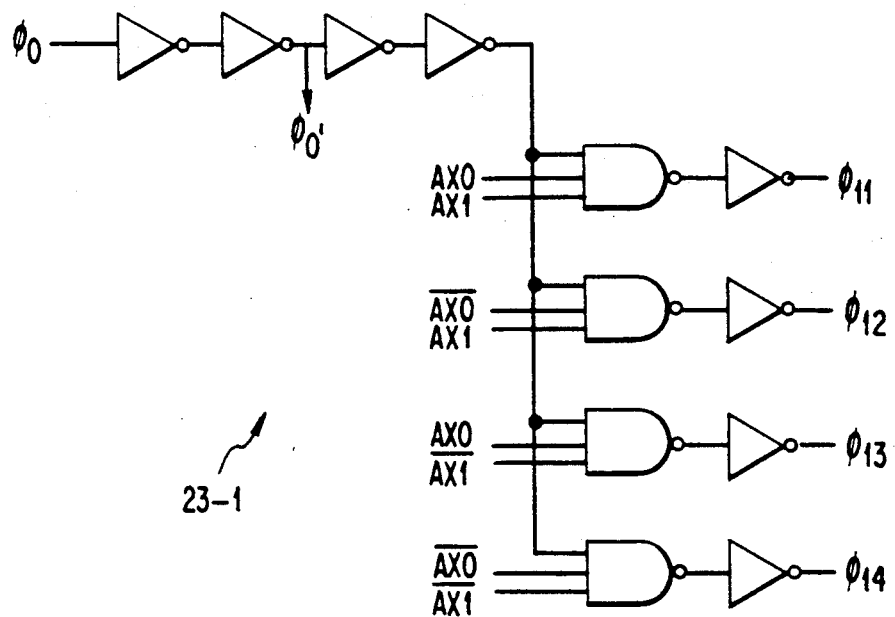
FIGS. 8A and 8B are circuit diagrams showing another example of a row decoder of FIG. 1.

FIGS. 7 and 8 show other examples of the delay circuit 40 and the row decoder 23. Referring to FIG. 7A, the delay circuit 40 comprises ten inverters $I_1$ to $I_{10}$ and two NAND gates $NA_1$ and $NA_2$. FIG. 7B shows the circuit for each of the inverters, which has a pair of MOSPT and MOSNT, and FIG. 7C is a circuit of each NAND gate with two MOSPT and two MOSNT. The signal $\phi_2$ is generated through six-stage inverters $I_{11}$ to $I_{16}$ from a signal $\phi_0$ which is also generated by $\overline{CE}$ or $R_1$. The signal $\phi_2$ is first delayed by the first two inverters $I_1$ and $I_2$ and is then delayed, if the control signal is at the low level, that is, if the operation mode is other than the self-refreshing mode, by the second NAND and the last three inverters $I_8$ to $I_{10}$ to produce the signal $\phi$. The delay time is determined by the six-stage gates and is short ($D_1 = 10$ nano sec., for example). If the control signal $\phi_S$ is at the high level, that is, in the case of the self-refreshing mode, the signal $\phi_2$ is transferred not directly but through additional six-stage gates $I_3$ to $I_7$ and $NA_1$ (to which the control signal $\phi_S$ is applied) from the second inverter $I_2$ to the second NAND gate $NA_2$. Therefore, the delay time of 10 nano second by the additional six-stage gates is added to the signal $\phi_2$. The delay time in this case is longer ($D_2 = 20$ nano sec.).

Figure 8B:
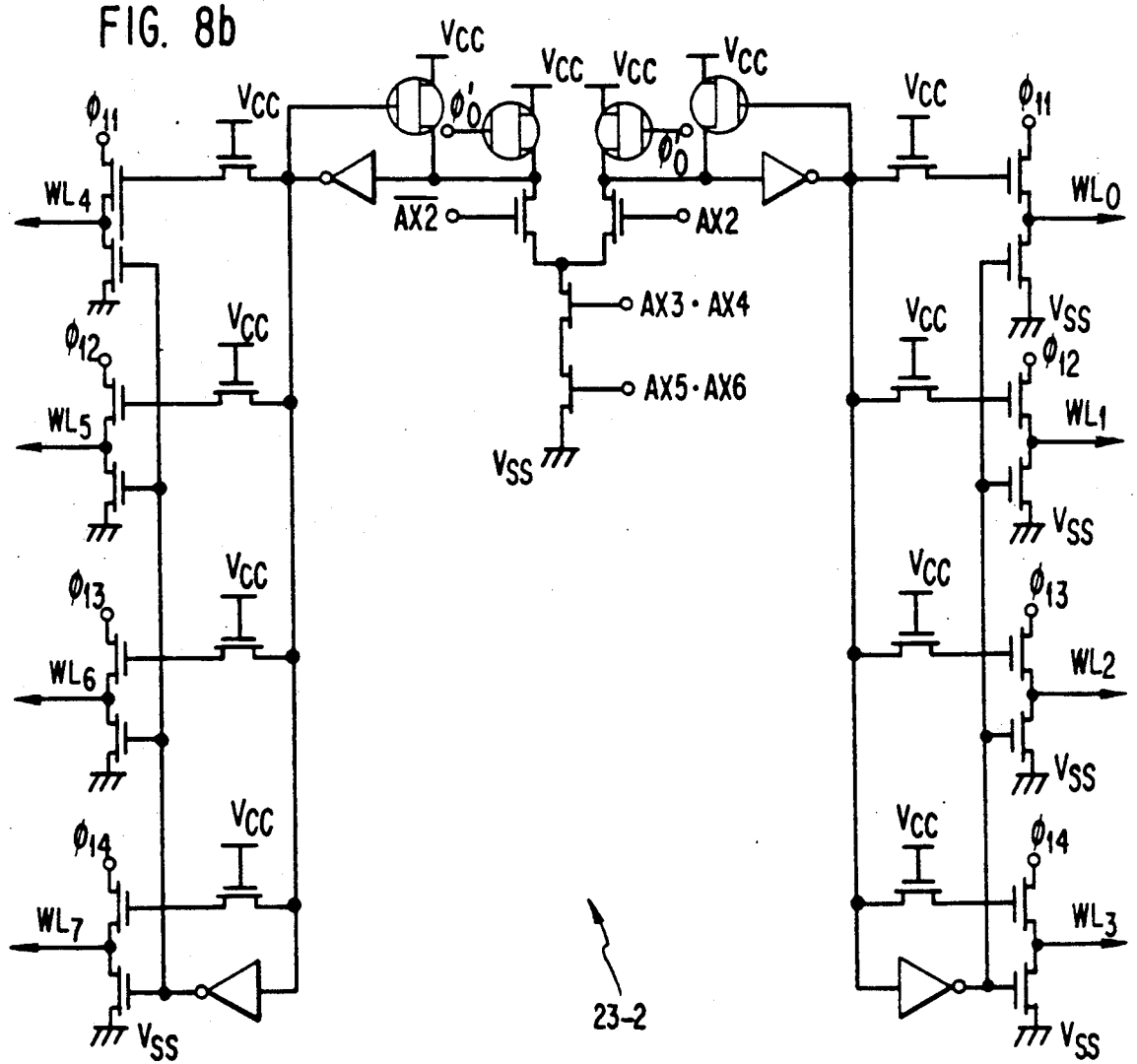

In one example of 1 Meg. bit pseudo-static RAM's, a number of row address signals is nine and that of the column address signal is eight. Among the nine row address signals $A_{x0}$ to $A_{x8}$, the first two $A_{x0}$ and $A_{x1}$ are used in a first-stage row decoder 23-1 shown in FIG. 8A. Four different combination of the true and the complement address signal $A_{x0}$, $A_{x1}$, $\overline{A}_{x0}$, and $\overline{A}_{x1}$ are applied to four 3-input NAND gates to select one of four word-line activation signals $\phi_{11}$, $\phi_{12}$, $\phi_{13}$, and $\phi_{14}$. Since the signal $\phi_0$ is delayed by six-stage gates to generate the word-line activation signals $\phi_{11}$ to $\phi_{14}$, the latter signals have substantially the same timing as the signal $\phi_1$ in FIG. 7A. The third to seventh row address signals $A_{x2}$ to $A_{x6}$ are used in second-stage row decoder 23-2 shown in FIG. 8B, which is the decoder for the combination of four true signals $A_{x3}$ to $A_{x6}$. There are other 15 second-stage row decoders for the other combinations. The last two row addresses $A_{x7}$ and $A_{x8}$ are used to select one of four memory cell blocks. As shown in FIG. 8B, one of the signals $\phi_{11}$ to $\phi_{14}$, that is, a signal equivalent to the signal $\phi_1$, is used to activate or drive a selected word line (one of $WL_0$ to $WL_7$).

Figure 9:
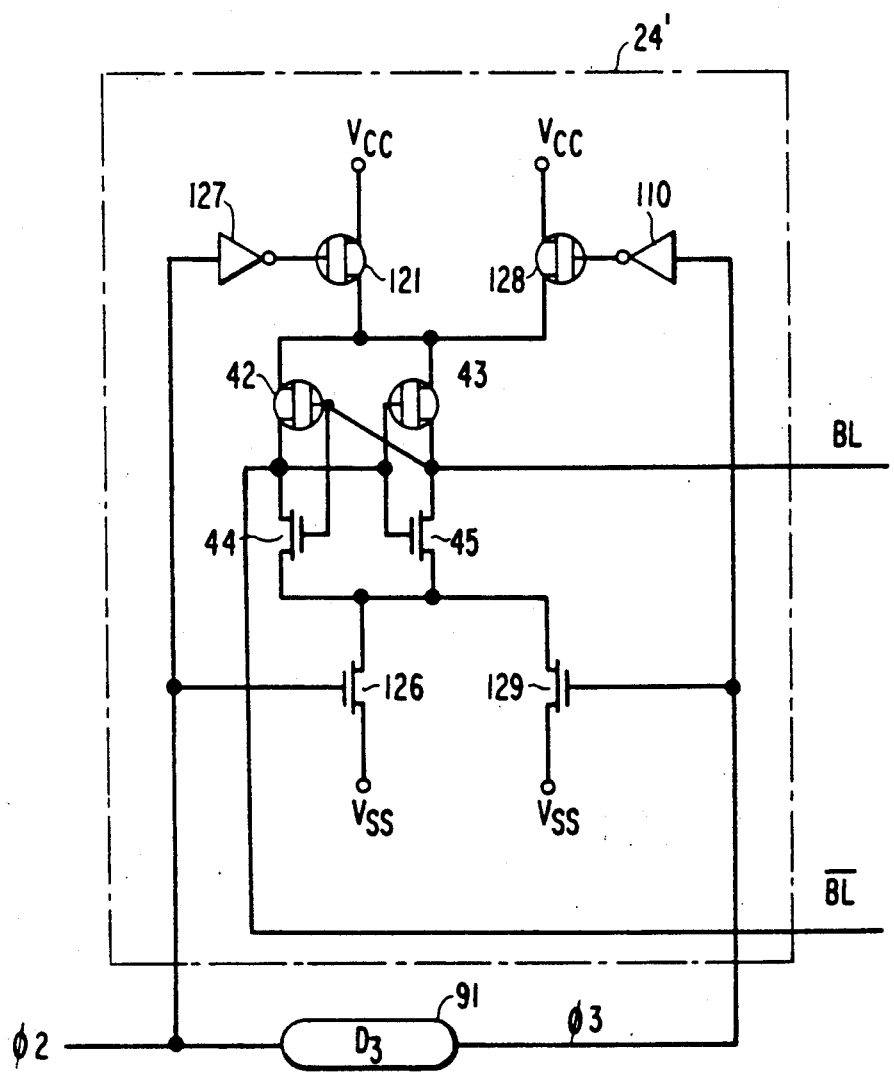
FIG. 9 is a circuit diagram of a two-stage amplification type sense amplifier according to another embodiment of the present invention.

The sense amplifier 24 shown in FIG. 2 has enable-gate transistors 41 and 46 which are large-sized and increase problems of malfunction and slow down operation when driven. To diminish the problems, a two-stage amplification type sense amplifier 24' shown in FIG. 9 is used, which has a pair of small-sized enabling transistors MOSPT 121 and MOSNT 126 and a pair of larger enabling transistors MOSPT 128 and MOSNT 129 in addition to the flip-flop made of the from transistors 42 to 45. The first-stage amplification is accomplished in response to a first activation signal $\phi_2$, and the second-stage amplification is accomplished in response to a second activation signal $\phi_3$ which is generated after a fixed delay time $D_3$ from the first activation signal by means of a delay circuit 91. The delay time $D_3$ between the activation signals $\phi_2$ and $\phi_3$ is often made short in order to speed up the memory cycle at the sacrifice of the sensitivity of the amplifier. By using the variable delay circuit 40 shown in FIG. 5 or FIG. 7A instead of the delay circuit 91 in FIG. 9, it is possible to switch from high-speed amplification in the ordinary memory cycle with a short delay time $D_1$ to a low-speed amplification in the self-refreshing mode with a long delay $D_2$, so that the sensitivity of the sense amplifier can be extended to the maximum.

As has been described hereinbefore, the present invention is advantageous in that the data holding time of the memory cells and/or the sensitivity of the sense amplifier can be increased in the self-refreshing mode more than that in the ordinary operation without deteriorating the high speed of the ordinary operation, by changing the activation timing of the sense amplifier activation signal through switching a plurality of delay elements for different modes. Another advantage is that the operation margin in the self-refreshing mode can be expanded by utilizing the information of the memory cell to 100%.

I claim:

1. A semiconductor memory comprising:
   a plurality of dynamic memory cells arrayed in a matrix of rows and columns and connected to word lines in rows and bit lines in columns,
   a plurality of address terminals receiving row address signals,
   a row decoder responsive to the row address signal received by said address terminals for selecting one of said word lines thereby allowing memory cells connected to the selected word line to produce data stored therein to corresponding bit lines in response to a first timing signal,
   a plurality of sense amplifiers coupled to said bit lines, respectively, said sense amplifiers amplifying data read-out to said bit lines, from the memory cells connected to the selected word line, in response to a second timing signal,
   a refresh signal terminal receiving a refresh signal having active and inactive levels, means for self-refreshing rows of said memory cells in said matrix in a self-refreshing mode when said refresh signal is at the active level, said self-refreshing means including means for internally producing row address signals to designate rows to be subjected to the self-refreshing, said self-refreshing means further comprising means coupled to said refresh signal terminal for generating a control signal of a first level representing the self-refreshing mode when said refresh signal is at the active level and a control signal of a second level when said refresh signal is at the inactive level, and a timing signal generator generating said first timing signal and said second timing signal after generation of said first timing signal, said timing signal generator generating said second timing signal after a first delay time from generation of said first timing signal when said control signal is at the first level and after a second delay time which is shorter than said first delay time from the generation of said first timing signal when said control signal is at the second level.

2. The memory as claimed in claim 1, in which said timing signal generator includes a first delay circuit having said second delay time, a second delay circuit having a second delay time means for applying said first timing signal to inputs of said first and second delay circuits and a selection circuit coupled to the outputs of said first and second delay circuits for deriving an output signal of said first delay circuit in response to the first level of said control signal and an output signal of said second delay circuit in response to the second level of said control signal and means responsive to said control signal to change connection of said delay circuits.

3. The memory as claimed in claim 1, in which said sense amplifiers are of two-stage amplification type, first-stage amplification being activated by said second timing signal and second-stage amplification being activated by a third timing signal, said timing signal generator further including means for generating said third timing signal after generation of said second timing signal with a third delay time when said control signal is at the first level and with a fourth delay time which is shorter than said first delay time when said control signal is at the second level.

* * * * *